United States Patent [19]

Brokaw

[11] Patent Number: 5,627,715
[45] Date of Patent: May 6, 1997

[54] CIRCUIT CONSTRUCTION FOR PROTECTIVE BIASING

[75] Inventor: A. Paul Brokaw, Burlington, Mass.

[73] Assignee: Analog Devices, Inc., Norwood, Mass.

[21] Appl. No.: 475,413

[22] Filed: Jun. 7, 1995

Related U.S. Application Data

[63] Continuation of Ser. No. 222,316, Apr. 1, 1994, abandoned, which is a continuation of Ser. No. 848,754, Mar. 10, 1992, abandoned.

[51] Int. Cl.⁶ .................................................. H02H 3/00
[52] U.S. Cl. ....................... 361/93; 257/547; 257/560
[58] Field of Search ............................ 361/58, 77, 82, 361/84, 88, 90, 91, 93, 100, 101; 257/546, 547, 556, 560, 562; 307/127; 327/564, 565, 581

[56] References Cited

U.S. PATENT DOCUMENTS

| | | | |
|---|---|---|---|
| 3,676,714 | 7/1972 | Wensink et al. | 307/303 |
| 3,751,680 | 8/1973 | Hodges | 307/213 |
| 3,829,709 | 8/1974 | Maigret et al. | 307/202 |
| 4,081,695 | 3/1978 | Allen et al. | 307/309 |
| 4,322,640 | 3/1982 | Fukushima et al. | 307/473 |
| 4,339,675 | 7/1982 | Ramsey | 307/473 |
| 4,376,900 | 3/1983 | Metzger | 307/473 |
| 4,426,658 | 1/1984 | Gontowski et al. | 357/48 |
| 4,709,167 | 11/1987 | Brokaw | 307/443 |
| 4,969,823 | 11/1990 | Lapham et al. | 437/31 |
| 5,065,214 | 11/1991 | Lapham et al. | 357/43 |

FOREIGN PATENT DOCUMENTS 0313526  4/1989  European Pat. Off. .

OTHER PUBLICATIONS

Grebene, Alan B., Bipolar and MOS Analog Integrated Circuit Design, 1984, p. 87.

E. Brunn, "Reverse-Voltage Proctection Methods for CMOS Circuits" IEEE Journal of Solid-State Circuits, vol. 24, No. 1, Feb. 1989, New York, U.S., pp. 100–103.

Patent Abstracts of Japan, vol. 6, No. 32 (E–96) 26 Feb. 1982 & JP,A,56 150 847 (NEC) 21 Nov. 1981.

Patent Abstracts of Japan, vol. 6, No. 160 (E–126) 21 Aug. 1982 & JP,A,57 080 769 (Pioneer) 20 May 1982.

*Primary Examiner*—Jeffrey A. Gaffin
*Assistant Examiner*—Ronald W. Leja
*Attorney, Agent, or Firm*—Wolf, Greenfield & Sacks, P.C.

[57] ABSTRACT

A circuit construction for biasing near a pocket containing a power supply potential circuit element in a junction-isolated circuit. In normal operation if the polarity of the supply voltage is reversed from that intended the pocket is disconnected. To achieve this, in one embodiment the emitter of a transistor is connected to the positve supply voltage. The collector of that transistor is used to bias the pocket, containing a circuit element, which in normal operation should receive the supply voltage. When the supply voltage is reversed, the emitter-base junction is reverse biased and the collector-base junction is turned off. The pocket is thus disconnected from the supply during supply reversal. The transistor may also have a second collector to handle reinjection of carriers when it is saturated. This second collector can be connected to the base or used by other circuits to detect when saturation occurs.

19 Claims, 3 Drawing Sheets

CIRCUIT CONSTRUCTION FOR PROTECTIVE BIASING

This application is a file-wrapper continuation of application Ser. No. 08/222,316, filed Apr. 1, 1994, which is a continuation application of Ser. No. 07/848,754, filed Mar. 10, 1992; both now abandoned.

FIELD OF THE INVENTION

The present invention pertains to a circuit for protecting circuit elements from reverse voltage. More particularly, the present invention pertains to a circuit for preventing damage to circuit elements, such as integrated circuits, when a reverse voltage appears at a power supply terminal.

BACKGROUND OF THE INVENTION

In electronic circuits designed to receive supply voltages at two input terminals herein called V+ and V−, the V+ terminal is intended to receive a higher (i.e., more positive) potential than the V− terminal in normal operation. Generally, the V+ terminal receives a positive voltage, relative to a reference ground, and the V− terminal receives a negative voltage; or both voltages may be of the same polarity but different in magnitude. In some cases, however, it is possible for the supply voltage connections to be reversed, for instance, by the attachment of a supply connector in reverse. Unfortunately, when the supply voltage to an electronic circuit is reversed, the electronic circuit may be damaged. Many types of circuits may be damaged by supply reversal, especially junction isolated integrated circuits.

FIG. 1 shows a partly isometric, partly cross-sectional view of a part of a typical prior art integrated circuit, which includes a p-type substrate 10, a buried layer 12 of n+ type material, an n-type epitaxial layer 14, an n+ type diffusion 20 formed in the epitaxial layer 14 to act as a contact, and p-type isolation bands 16. The buried layer 12, epitaxial layer 14 (enclosed within junction isolation bands 16) and diffusion 20 are commonly referred to as the "pocket". The pocket is typically biased as close to V+ as possible while the p-type isolation bands are biased at V−. The p-n junction formed between the pocket and the isolation bands 16 is thus reverse biased. If supply reversal occurs, this junction becomes forward biased and the circuit will be damaged. To prevent forward biasing of this junction in this case, the pocket is often connected to the V+ supply via a diode (not shown). When supply reversal occurs, the diode disconnects the pocket from the power supply and this junction is not forward biased. Unfortunately, some circuit elements formed in such n-type pockets require biasing the pocket closer to the V+ supply than a diode allows. Two examples of such circuit elements are thin film resistors and diffused resistors.

Also shown in FIG. 1 is a thin film resistor 18 formed on an oxide layer (not shown) on the upper surface of the epitaxial layer 14. With such a thin film resistor 18, if the pocket is biased more negative than the resistor, for example, by a diode offset, the electrical field generated from the voltage differential may cause long term corrosion of the thin film resistor 18. Therefore, a diode cannot be used to connect the pocket to the V+ supply. However, a direct connection between the pocket and the V+ supply will result in damage to the circuit when supply reversal occurs.

FIG. 2 shows a partly isometric, partly cross-sectional view of a typical prior art integrated circuit including a p-type diffusion resistor 22. The construction of this integrated circuit is otherwise generally similar to that of FIG. 1. With such a construction, the resulting p-n junction between the resistor 22 and the n-type pocket must remain reverse biased. Because a voltage differential of a diode offset would be sufficient to forward bias this junction (assuming the resistor is connected to the V+ supply), a diode cannot be used to connect the pocket to the V+ supply. However, a direct connection between the pocket and the V+ supply will result in damage to the circuit when supply reversal occurs.

Connection of n-type pockets directly to a positive (V+) supply terminal ordinarily is not a problem. However, for automotive circuits or other products which require protection against negative voltages on the positive supply terminal, connection of n-type pockets to the positive (V+) supply terminal can create problems. A reverse voltage causes the junction formed between the p-type isolation bands and substrate and the n-type pocket to be forward biased. This results in clamping of the positive supply terminal to within less than a volt of the negative supply terminal. In the case of automotive circuits, large currents are available during field decay events and when a battery is connected in reverse. The integrated circuit, or more likely the bond wires, will be completely destroyed by such a reverse connection of a battery or during field decay events.

Other types of integrated circuits can also be damaged by supply reversal. The present invention may be readily applied to such circuits as well.

Accordingly, it is an object of the present invention to provide a circuit construction for protective biasing of integrated circuit elements.

Another object of the invention is to provide a circuit means which provides transistor isolation and prevents injection of unwanted carriers when a negative voltage is applied to the positive supply terminal.

Yet another object of the invention is to provide a circuit means which protects integrated circuit elements from reverse supply connection, and in particular, protects automotive circuits from reverse connection of a battery.

SUMMARY OF THE INVENTION

The foregoing and other objects of the present invention are achieved by using the collector voltage of a saturated pnp transistor, which has its emitter connected to the more positive supply voltage V+, to bias the pocket enclosing a circuit element close to the V+ supply. When the supply voltage is reversed, the emitter-base junction of the transistor becomes reverse biased, allowing its collector-base junction to turn off. As a consequence, the pocket enclosing a circuit element becomes disconnected from the V+ supply. Therefore, the p-n junction between the n-type pocket and the p-type junction isolation bands and substrate does not become forward biased. Moreover, for p-type diffused resistors in an n-type pocket, the resistor can be driven negative. The pnp transistor which biases the pocket may also be provided with an additional collector to handle leakage of carriers to the isolation bands during saturation.

The foregoing and other objects, features and advantages of the invention will be apparent from the following more particular description of a preferred embodiment of the invention with reference to the accompanying drawings.

DETAILED DESCRIPTION

An embodiment of the invention will now be described in detail in connection with FIGS. 3–6. Similar reference numbers in the figures indicate similar structures.

Figure 3:
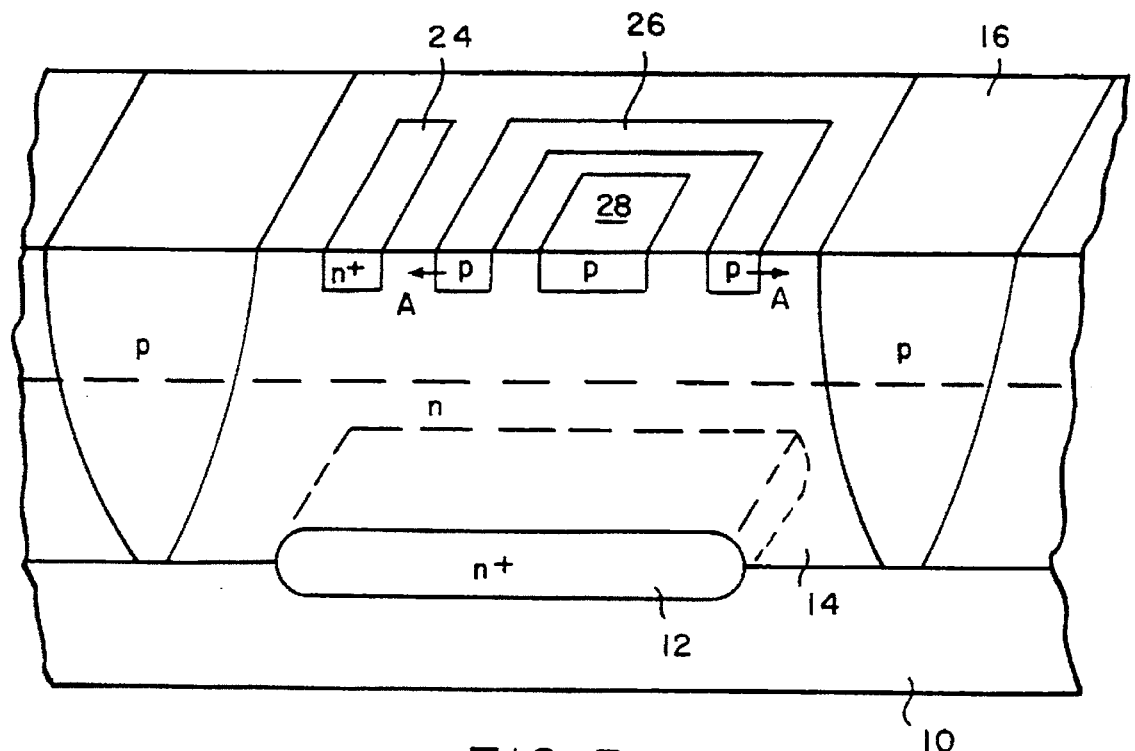
FIG. 3 is an isometric, cross-sectional view of a lateral pnp transistor to be used in accordance with the present invention.

FIG. 3 shows a lateral pnp transistor having a base defined by n-type regions 12, 14, and 24, a collector 26 and an emitter 28. The n+ type region 24 provides a connector to the base.

Figure 2:
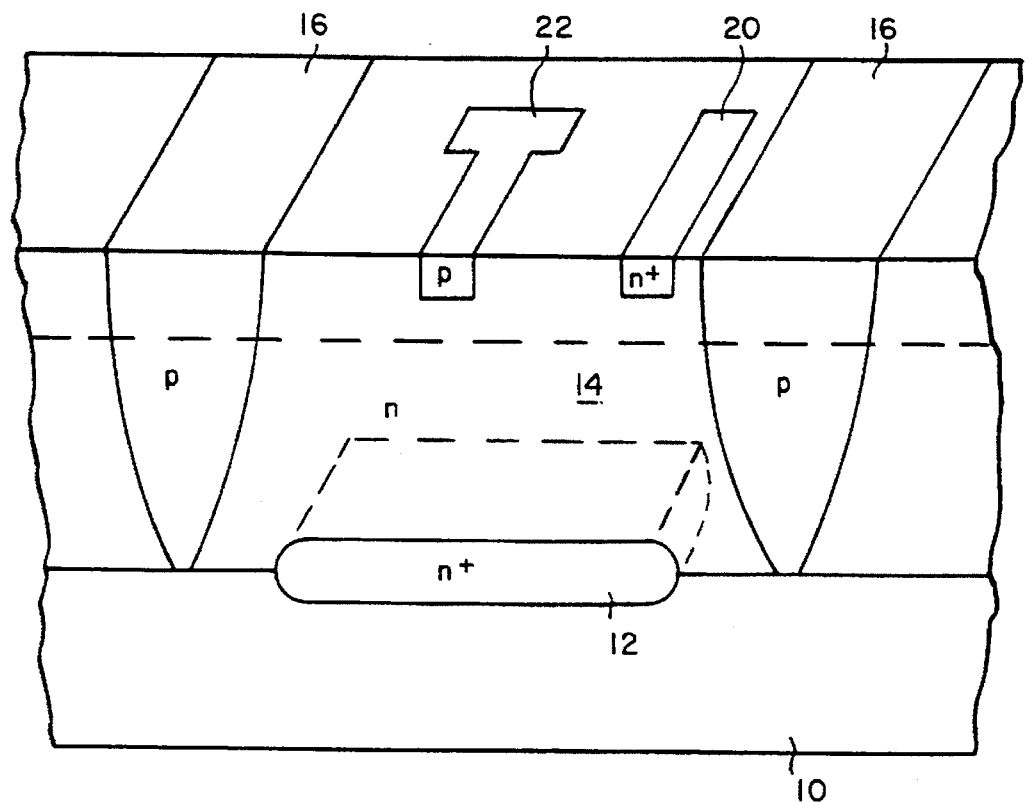
FIG. 2 is an isometric, cross-sectional view of a typical diffused resistor formed in a typical prior art integrated circuit.
Figure 4:
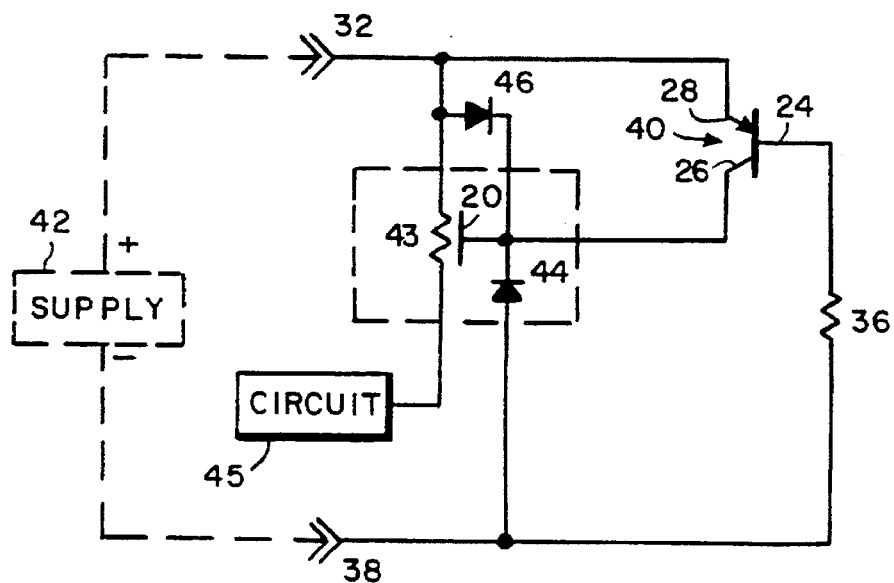
FIG. 4 is a schematic diagram of an exemplary circuit according to the present invention for use in protecting a resistor.
Figure 5:
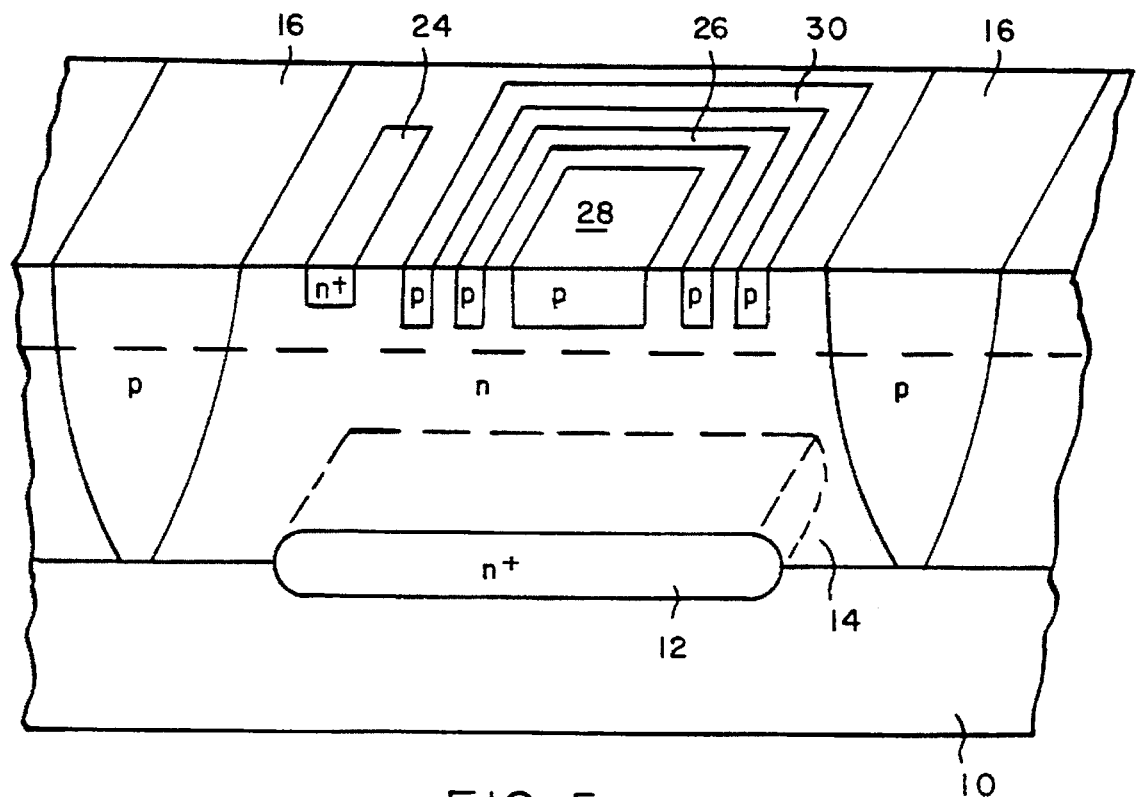
FIG. 5 is an isometric, cross-sectional view of a lateral pnp transistor incorporating an additional ring of material.

Referring now to FIG. 4, the pnp transistor 40 schematically represents the transistor shown in FIG. 3. The emitter 28 of this transistor is connected to a supply rail 32 which, in normal operation, receives a V+ supply voltage from a supply 42. A resistor 36 is connected between the base 24 and supply rail 38 which, in normal operation, receives a V− supply voltage. The resistor 36 is used as a drive to cause the transistor 40 to saturate. The collector 26 of transistor 40 is connected to a pocket enclosing a circuit element (a diffused resistor 43, for example) to bias the pocket with the saturation voltage $V_{CESAT}$. Resistor 43 is connected between the V+ supply rail 32 and a circuit 45 (via conductive traces, not shown). The details of circuit 45 are irrelevant to this discussion since numerous circuits may be employed. If the resistor 43 is a p-type diffused resistor (as shown in FIG. 2), it forms a diode 46 with the pocket. P-type substrate 10 and isolation diffusion regions 16 of the circuit, such as shown in FIG. 2, form a diode 44 with the pocket defined by regions 12, 14 and 20. These p-type regions 10 and 16 are normally connected to the V− supply rail 38, so that the p-n junction between p-type regions 10 and 16 and the pocket (n-type regions 12, 14 and 20) is reversed biased.

When the supply voltage is reversed, for example in an automotive circuit when an automobile battery is improperly connected with its terminals reversed, the lower potential appears on rail 32, and the emitter-base junction of transistor 40 becomes reverse biased, causing its collector-base junction to turn off. As a consequence, the pocket enclosing resistor 43 is disconnected from the voltage on rail 32. Therefore, the p-n junction between the n-type pocket and p-type isolation bands 16 and region 10 is not forward biased, thus protecting the pocket from damage. Moreover, the p-type resistor 43 can be driven negative without damage by the reversed voltage appearing on rail 32. Because the pnp transistor 40 (FIG. 4) operates in saturation, an undesirable current occurs due to the leakage of carriers to the p-type regions 10 and 16, as represented at arrow A in FIG. 3. To eliminate the undesirable current, a ring of material 30 (FIG. 5) of the same type of material (e.g., p-type) as collector 26 surrounds the collector 26 to intercept carriers and return the corresponding current to the base 24 by an appropriate interconnection (such as via conductive traces, not shown). This interconnection is shown schematically in FIG. 6 at node 34. The interception of carriers by the ring of material 30 diminishes the drive current to the transistor base 24, so as to minimize excess emitter current. The emitter current thus consists mostly of the drive current from the drive resistor 36 (FIG. 4), or other current-limited drive which may be used, and any load current delivered by the collector. Without the ring of material 30, a large current would be drawn at the emitter 28 and delivered to the substrate 10. If the extra emitter current does not create a problem, the ring of material 30 may be disconnected from the base and used to provide current to operate other circuits at lower voltage, or simply as an indication that the pnp collector is saturated.

Figure 1:
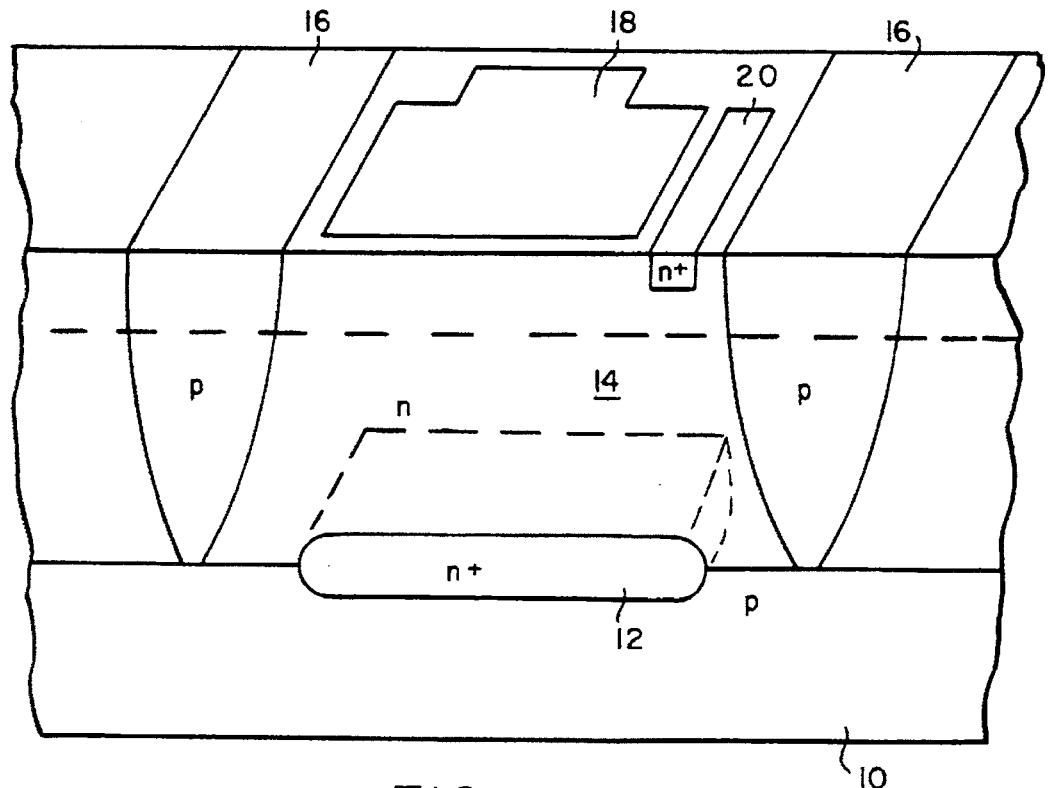
FIG. 1 is an isometric, cross-sectional view of a typical thin-film resistor formed in a typical prior art integrated circuit.
Figure 6:
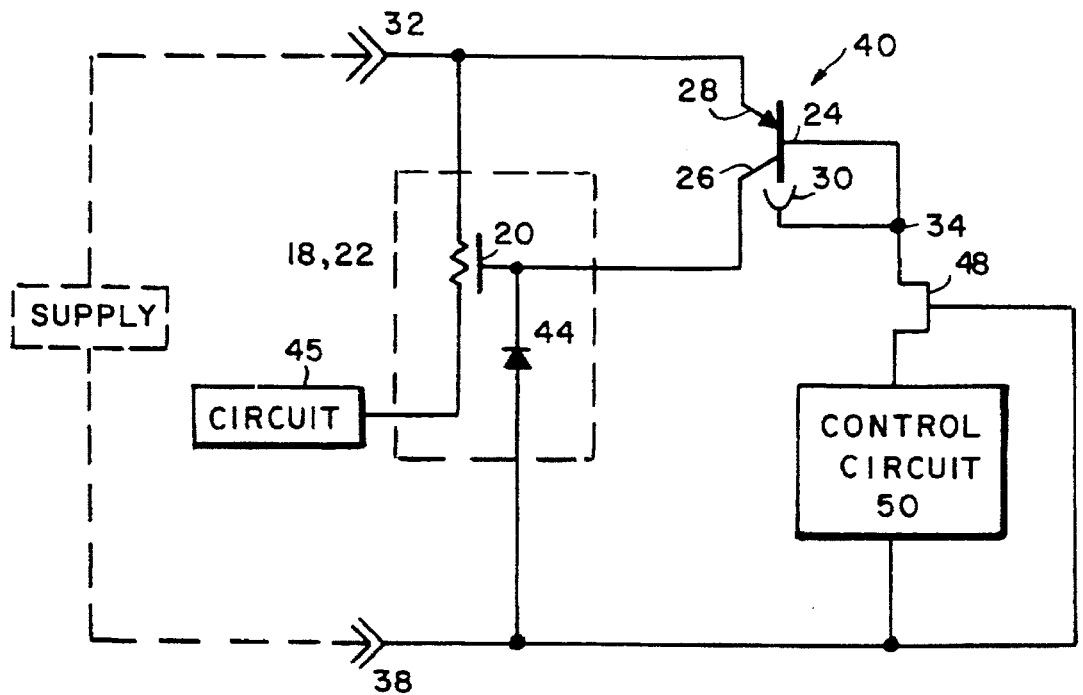
FIG. 6 is a schematic diagram of an exemplary circuit according to the present invention connected to the drain of an epi-FET.

Referring now to FIG. 6, the pnp transistor 40 may also be used to provide functions other than the disconnect function described above. The base current used to bias the pnp transistor 40 in an "on" state, can also be used internally in the circuit. Furthermore, the disconnect feature can be used to protect other structures, such as an FET 48 and/or a control circuit 50. In FIG. 6, the resistor 36 of FIG. 1 has been replaced by an epi-FET 48 in series with control circuit 50. The drain of an epi-FET, used for startup or some other purpose, cannot be connected directly to the supply voltage V+, since it would be forward biased to the substrate by a reverse transient. By combining the epi-FET 48 with the pnp transistor 40, the startup current is allowed to bias the pnp transistor 40 while the disconnect feature protects the epi-FET 48. The control circuit 50 may be any circuit which can be damaged by a reverse voltage appearing at the positive terminal.

It should be understood that the foregoing description of the invention is intended merely to be illustrative thereof, having been presented by way of example only. Numerous other embodiments, modification and equivalents may be apparent to those skilled in the art without departing from its spirit. For instance, an alternative embodiment of the present invention may incorporate an npn transistor in place of the pnp transistor 10, and connect it to the negative supply voltage V− to protect integrated circuits from the appearance of a positive voltage across the negative supply terminal. Having thus described the invention, what I claim is:

I claim:

1. A circuit construction for protective biasing of an electrical circuit, comprising:

first and second means, for connection to a source, for receiving a supply voltage of a predetermined polarity therebetween;

means for protecting the electrical circuit if and when the source is connected to the first and second means for receiving such that the polarity therebetween is the reverse of the predetermined polarity, the means for protecting including a transistor having a substrate of a first type of semiconducting material, a base of a second type of semiconducting material, formed on the substrate and receiving a base drive current, a collector and an emitter each made of the first type of semiconducting material and formed in the base, and means for collecting carriers reinjected from the collector into the base of the transistor when said transistor is saturated and for reducing the base drive current to a level maintaining the transistor in saturation, wherein the emitter is connected to the second means for receiving, and the collector is connected to the electrical circuit, and means for connecting the base to the first means for receiving.

2. The circuit construction of claim 1, wherein said means for connecting the base of the transistor includes bias means for causing the transistor to saturate.

3. The circuit construction of claim 2, wherein the bias means comprises a field effect transistor having a source, a gate connected to said first means for receiving, and a drain connected to the base of the transistor.

4. The circuit construction of claim 1, wherein the electrical circuit is a resistor of the first type of semiconducting material formed on a pocket of a second type of semiconducting material formed on the substrate.

5. The circuit construction of claim 4 wherein said pocket is a n-type pocket and said resistor is a p-type resistor.

6. The circuit construction of claim 1, wherein said means for collecting carriers is a ring of said first type of semiconducting material formed in the base and surrounding the collector and connected directly to the base of said transistor.

7. The circuit construction of claim 1, wherein said transistor is a pnp transistor, and said supply voltage is a positive supply voltage.

8. The circuit construction of claim 1, wherein said transistor is an npn transistor and said supply voltage is a negative voltage.

9. The circuit construction of claim 1, wherein said electrical circuit is an automotive circuit and said supply voltage is supplied by an automobile battery.

10. A circuit construction for protective biasing of a circuit comprising:

first and second means for connection to a source for receiving a supply voltage of a predetermined polarity therebetween;

a transistor having a substrate of a first type of semiconducting material, a base of a second type of semiconducting material, formed on the substrate and receiving a base drive current, a collector and an emitter each made of the first type of semiconducting material and formed in the base, and a ring of the first type of semiconducting material formed in the base and surrounding the collector and for collecting carriers reinjected from the collector into the base of the transistor when said transistor is saturated, and means for electrically connecting the ring to the base such that the base drive current is reduced to a level maintaining the transistor in saturation, wherein the emitter is connected to the second means for receiving, the collector is connected to the circuit, the base is connected via a biasing circuit to the first means for receiving and the substrate is connected to the first means for receiving.

11. The circuit construction of claim 10, wherein the means for electrically connecting is a direct electrical connection between the ring and the base of the transistor.

12. A circuit construction of a transistor which controls saturation of the transistor, comprising:

a substrate formed of a first type of semiconducting material;

a base formed of a second type of semiconducting material on the substrate and receiving a base drive current;

a collector and an emitter each made of the first type of semiconducting material formed in the base; and a ring of the first type of semiconducting material, formed in the base and surrounding the collector, for collecting carriers reinjected from the collector into the base of the transistor when the transistor is saturated; and means for electrically connecting the ring to the base of the transistor such that the base drive current is reduced to a level maintaining the transistor in saturation.

13. The circuit construction of claim 12, wherein the means for electrically connecting is a direct electrical connection between the ring and the base of the transistor.

14. A circuit construction of a lateral transistor which controls saturation of the transistor, comprising:

a substrate of a first type of semiconducting material;

a transistor, having a base receiving a base drive current, a collector, and an emitter, formed on the substrate; and a region of the first type of semiconducting material, formed in the base and surrounding the collector and constructed and arranged to intercept carriers flowing from the transistor to the substrate, and electrically connected directly to the base of the transistor such that the base drive current is reduced to a level maintaining the transistor in saturation.

15. A circuit construction for protective biasing of a first electrical circuit and a second electrical circuit, comprising:

first and second means for connection to a source for receiving a supply voltage of a predetermined polarity therebetween;

a transistor structure having a substrate of a first type of semiconducting material, a base of a second type of semiconducting material, formed on the substrate and receiving a base drive current, a collector and an emitter each made of the first type of semiconducting material and formed in the base, and a ring of the first type of semiconducting material that surrounds the collector formed in the base and that collects carriers injected from the collector into the base;

the collector, the base, and the emitter defining a transistor coupled between the first electrical circuit and the first means for receiving, wherein the transistor operates in saturation to bias the first electrical circuit with an offset of a saturation collector-to-emitter voltage drop from a voltage at the first means for receiving, and wherein the transistor disconnects the first electrical circuit from the first means for receiving when said source is connected such that the polarity between said first and second means for receiving is the reverse of the predetermined polarity; and the ring, the base, the emitter, and the collector defining a protective circuit coupled between the second electrical circuit and the first means for receiving, wherein the ring is coupled to the base such that the base drive current is reduced to a level maintaining the transistor in saturation, and such that the protective circuit acts to bias the second electrical circuit when the first transistor operates in saturation, and wherein the protective circuit disconnects the second electrical circuit from the first means for receiving when said source is connected such that the polarity between said first and second means for receiving is the reverse of the predetermined polarity.

16. A circuit construction for protective biasing as in claim 15, wherein the ring is coupled to the base through a conductive trace.

17. An integrated circuit construction of a lateral PNP transistor for controlling drive current to the transistor while maintaining the operation of the transistor in saturation, comprising:

a substrate of P type semiconducting material;

a base of an N type semiconducting material, formed on the substrate and constructed to receive the drive current;

a collector and emitter, each formed of a P type semiconducting material in the base;

a ring of P type semiconducting material, formed in the base and surrounding the collector; and an electrically conductive trace connecting the ring to the base such that during saturation, excess collector carriers reinjected into the base from the collector are intercepted by the ring, thereby reducing the drive current and generation of the excess collector carriers while maintaining saturation.

18. A circuit construction of a lateral PNP transistor providing protective biasing for an electrical circuit and for controlling drive current to the transistor while maintaining saturation, comprising:

a substrate of P type semiconducting material;

a base of an N type semiconducting material and formed on the substrate and constructed to receive the drive current;

a collector and emitter, each of a P type semiconducting material, formed in the base;

a ring of P type semiconducting material, formed in the base and surrounding the collector;

an electrically conductive trace connecting the ring to the base;

first and second means for connection to a source for receiving a supply voltage of a predetermined polarity therebetween;

wherein the emitter is connected to the second means for receiving, the collector is connected to the electrical circuit, the base is connected via a biasing circuit to the first means for receiving and the substrate is connected to the first means for receiving;

such that when the supply voltage has reversed polarity, the electrical circuit is disconnected from the supply, and further, when the supply voltage has the correct polarity, the lateral PNP transistor is operating in saturation, wherein excess collector carriers reinjected into the base from the collector are intercepted by the ring, thereby reducing the drive current and generation of the excess collector carriers while maintaining saturation.

19. A circuit construction of a lateral transistor for controlling drive current while maintaining saturation, comprising:

a substrate of first type of semiconducting material;

a base of an second type of semiconducting material formed on the substrate and constructed to receive the drive current;

a collector and emitter, each of the first type of semiconducting material, formed in the base; and an element of the first type of semiconducting material, formed in the base, surrounding the collector and electrically connected to the base, for intercepting the collector carriers which are reinjected into the base during saturation thereby reducing the base drive current.

* * * * *